United States Patent
Chang

(10) Patent No.: US 10,672,861 B1
(45) Date of Patent: Jun. 2, 2020

(54) MEMORY CHIP DESIGN FOR MANUFACTURING

(71) Applicant: Marvell International Ltd., Hamilton (BM)

(72) Inventor: Runzi Chang, San Jose, CA (US)

(73) Assignee: Marvell International LTD., Hamilton (BM)

( * ) Notice: Subject to any disclaimer, the term of this patent is extended or adjusted under 35 U.S.C. 154(b) by 157 days.

(21) Appl. No.: 15/927,889

(22) Filed: Mar. 21, 2018

Related U.S. Application Data

(60) Provisional application No. 62/486,793, filed on Apr. 18, 2017.

(51) Int. Cl.
| | |
|---|---|
| *H01L 49/02* | (2006.01) |
| *H01L 27/02* | (2006.01) |
| *H01L 23/544* | (2006.01) |
| *H01L 27/105* | (2006.01) |
| *G06F 30/392* | (2020.01) |
| *H01L 29/66* | (2006.01) |

(52) U.S. Cl.
CPC ........... *H01L 28/20* (2013.01); *G06F 30/392* (2020.01); *H01L 23/544* (2013.01); *H01L 27/0207* (2013.01); *H01L 27/1052* (2013.01); *H01L 29/66606* (2013.01); *H01L 2223/54426* (2013.01)

(58) Field of Classification Search
CPC . H01L 28/20; H01L 27/0207; H01L 27/1052; H01L 23/544; H01L 29/66606; H01L 2223/54426; G06F 17/5072
See application file for complete search history.

(56) References Cited

U.S. PATENT DOCUMENTS

| | | | | |
|---|---|---|---|---|
| 4,560,583 | A * | 12/1985 | Moksvold | H01C 17/23 257/E21.004 |
| 2010/0167427 | A1 * | 7/2010 | Howard | H01L 22/12 438/13 |
| 2015/0311272 | A1 * | 10/2015 | Romanescu | H01L 27/0629 257/379 |

\* cited by examiner

*Primary Examiner* — Nha T Nguyen

(57) ABSTRACT

Techniques create a semiconductor layout comprising a resistor structure having a defined baseline sheet resistance. The semiconductor layout includes a resistor marker layer over the resistor structure. A sheet resistance matching estimate is performed to ascertain a difference between the baseline sheet resistance and a resultant sheet resistance if the resistor structure were to be manufactured using a manufacturing process. A mask generating algorithm is generated based on the difference effective to achieve a sheet resistance of the resistor structure that is closer to the baseline sheet resistance rather than the resultant sheet resistance. The mask generating algorithm enables one or more masks to be generated to modify the resistor structure relative to the resistor marker layer.

20 Claims, 12 Drawing Sheets

MEMORY CHIP DESIGN FOR MANUFACTURING

CROSS REFERENCE TO RELATED APPLICATION

This present disclosure claims priority to U.S. Provisional Patent Application Ser. No. 62/486,793, filed Apr. 18, 2017, the disclosure of which is incorporated by reference herein in its entirety.

BACKGROUND

The background description provided herein is for the purpose of generally presenting the context of the disclosure. Unless otherwise indicated herein, the approaches described in this section are not prior art to the claims in this disclosure and are not admitted to be prior art by inclusion in this section.

In modern memory chips or SoC chips which contain high density memories, the chip areas are dominated by memory bitcells and arrays. On the other hand, passive devices, such as high precision Poly/OD resistors in these chips, can be formed as parasitic devices with specific designed sheet resistance (Rs) values. A "fabless" design house company typically designs semiconductor devices, and then turns over manufacture of these devices to various manufacturers. Fabless design house companies would prefer to have the flexibility of multiple available manufacturers for a number of reasons including business leverage and cost competition. Thus, fabless design houses typically request foundries to provide footprint-compatible memory bitcells and logic devices (e.g., memory periphery transistors), and tune the processes so that the memory and logic transistors of the chip achieve the required electrical performance. Accordingly, it should be no problem to port these designs between foundries.

However, due to fundamental process technology differences (e.g., different equipment, dopants, materials, etc.) from one foundry to another, if the circuit design is such that the graphic design system (GDS) footprint is to remain the same and only modifications to the process are to be made in order to maintain the same Rs in order to facilitate memory design porting from one foundry to another, such often requires adding at least one extra masking operation to, for example, change the implant dosage for the desired Rs. In some cases, for polysilicon resistors, two masks may be required including one to remove underlying metal or alloy film in order to achieve a higher Rs. Needless to say, this adds process complexity and thus, negatively impacts the yield and cost of the manufacturing due to more manufacturing operations.

As an example, consider FIG. 1 which illustrates an example gate-last Hi-K Metal Gate (HKMG) assembly generally at 100. HKMG assembly 100 includes active devices in an area 102 adjacent shallow trench isolation (STI) region 104. Formed over STI region 104 is a high precision resistor which, in this case, comprises an unsilicided polysilicon resistor 106 including two silicided end portions 107. In the bottommost view, taken a long line A-A' in the topmost view, it can be seen that the un-silicided polysilicon resistor 106 and corresponding end portions 107 are disposed atop a Hi-K protection metal or alloy layer 108 and a Hi-K layer 110. Also shown is an active device 112 in the form of a metal oxide semiconductor (MOS) capacitor that, together with resistor 106, form a resistance-capacitor (RC) network that can be included within a semiconductor chip, in accordance with various embodiments of the present disclosure. The RC network includes a silicon substrate 114 that is configured with the MOS capacitor. The MOS capacitor includes a well 116 that has been doped with one of either N-type or P-type dopants. The corners 118, 120 of the well 116 are further doped with the other type of dopant.

The MOS capacitor includes a high-k (where k is a dielectric constant and the high-k is with respect to the dielectric constant of silicon dioxide) gate oxide layer 122 that is provided at a top portion of the MOS capacitor. A metal gate 124 is provided over the high-k gate oxide layer 122 between spacers (not specifically designated). Contacts 126 for the MOS capacitor are provided and include silicide portions at the bottommost layer, a tungsten layer atop the silicide portions, and a metal layer atop the tungsten layer.

As noted above, in such designs, in order to achieve the desired Rs value for the high precision resistors, either an extra masking operation is utilized to change the implant dosage for the desired Rs, or two masks are needed including one additional mask to remove the underlying metal or alloy layer 108.

SUMMARY

This summary is provided to introduce subject matter that is further described in the Detailed Description and Drawings. Accordingly, this Summary should not be considered to describe essential features nor used to limit the scope of the claimed subject matter.

In some aspects, a method comprises creating a semiconductor layout comprising a resistor structure. The resistor structure has a defined baseline sheet resistance. The semiconductor layout includes a resistor marker layer over the resistor structure. A sheet resistance matching estimate is performed to ascertain a difference between the baseline sheet resistance and a resultant sheet resistance if the resistor structure were to be manufactured using a manufacturing process. A mask generating algorithm is generated based on the difference effective to achieve a sheet resistance of the resistor structure that is closer to the baseline sheet resistance Rs rather than the resultant sheet resistance Rsr. The mask generating algorithm enables one or more masks to be generated to modify the resistor structure relative to the resistor marker layer.

In other aspects, a method comprises creating a semiconductor layout comprising a high-K metal gate and a resistor structure. The resistor structure has a defined baseline sheet resistance. The semiconductor layout includes a resistor marker layer over the resistor structure. A sheet resistance matching estimate is performed to ascertain a difference between the baseline sheet resistance and a resultant sheet resistance if the resistor structure were to be manufactured using a manufacturing process. A mask generating algorithm is generated based on the difference effective to achieve a sheet resistance of the resistor structure that is closer to the baseline sheet resistance rather than the resultant sheet resistance. The mask generating algorithm enables one or more masks to be generated to modify the resistor structure relative to the resistor marker layer.

In other aspects, a method comprises creating a semiconductor layout comprising a resistor structure. The resistor structure has a defined baseline sheet resistance. The semiconductor layout includes a resistor marker layer over the resistor structure. A sheet resistance matching estimate is performed to ascertain a difference between the baseline sheet resistance and a resultant sheet resistance if the resistor structure were to be manufactured using a manufacturing process. A mask generating algorithm is generated based on the difference effective to achieve a sheet resistance of the resistor structure that is closer to the baseline sheet resistance rather than the resultant sheet resistance. The mask generating algorithm enables one or more masks to be generated to modify the resistor structure relative to the resistor marker layer. At least one mask is generated using the mask generating algorithm and a semiconductor wafer is processed using the at least one mask to generate the resistor structure.

The details of one or more implementations are set forth in the accompanying drawings and the following description. Other features and advantages will be apparent from the description and drawings, and from the claims.

BRIEF DESCRIPTION OF THE DRAWINGS

The details of one or more aspects of methods for using a first lithography mask and a second lithography mask to fabricate an IC die with differing gate oxide thicknesses for programmable memory devices and processor core devices of the IC die are described below. The use of the same reference numbers in different instances in the description and the figures may indicate like elements.

DETAILED DESCRIPTION

Overview

Figure 1:
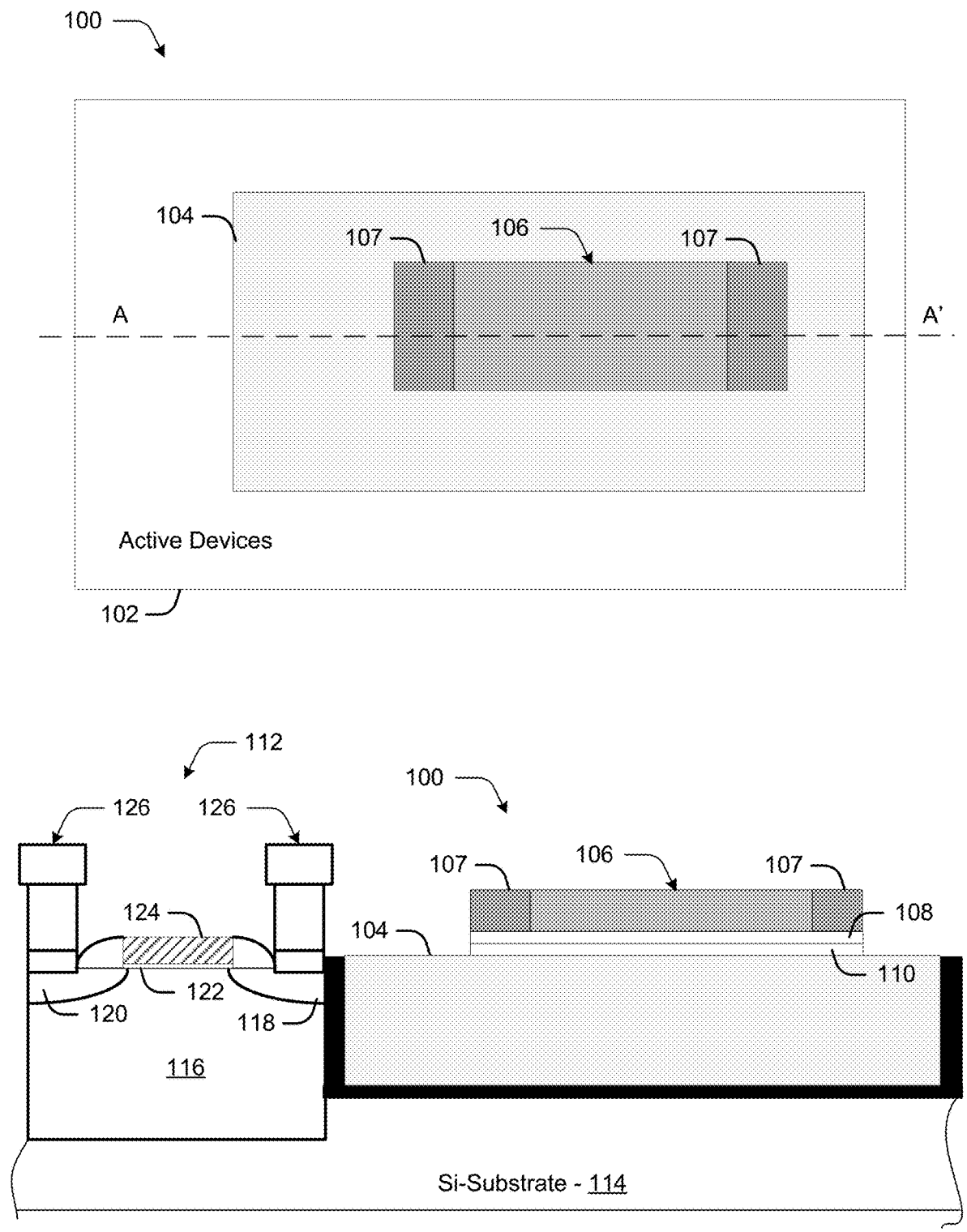
FIG. 1 illustrates an example gate-last Hi-K Metal Gate (HKMG) assembly.

The techniques described herein enable a semiconductor design layout for memory circuitry to be created and include resistor structures that are designed to have specific sheet resistance (RS) values. The techniques are then able to analyze the expected resultant sheet resistance values of these resistor structures, were the resistor structures to be fabricated with different process technologies whose processing parameters can vary. In the event that the expected resultant sheet resistance values vary undesirably from the specifically-designed sheet resistance values, structural adjustments can be made to the resistor structures at manufacture time, to ensure that the expected resultant sheet resistance values match, within designed tolerances, the specifically-designed sheet resistance values reflected in the semiconductor design layout. This is achieved, in at least some embodiments, by customizing one or more masks that are utilized to fabricate the resistor structures. Masks can be customized through the use of a customized mask adjustment algorithm that is formulated based upon analysis of the expected resultant sheet resistance values in view of the specifically-designed sheet resistance values reflected in the semiconductor design layout.

In one or more embodiments, layout marker layers are utilized over top of resistors which require sheet resistance (Rs) matching in the original memory layout design defined by or "drawn" by a graphic design system (GDS). When the layout design is ported to a different foundry or process technology, the layout marker layers appearing in the layout design are utilized to perform resistor modifications such as, by way of example and not limitation, sizing adjustments such as width and length adjustments and shape tuning depending on the Rs difference from that of the original process. Resistor modifications can be done through processing techniques such as Logic Operation (LOP) or Optical Proximity Correction (OPC) in the manufacturing flow. A logic operation LOP typically involves estimating the difference between a baseline sheet resistance Rs of a resistor structure in a layout, and a resultant sheet resistance (Rsr) of the same resistor structure if the resistor structure were to be manufactured using a particular manufacturing process, such as one employed by one or more different foundries or process technologies. Once the difference is ascertained, the logic operation may be employed to generate a custom mask or masks such as, for example, by modifying the layout of the resistor structure by 0.5× in a particular dimension, as will become apparent below. Optical Proximity Correction (OPC) refers to a photolithography enhancement technique commonly used compensate for image errors due to diffraction or process effect. OPC techniques are utilized to compensate for the limitations of light. Other techniques can, of course, be utilized to perform resistor modifications without departing from the spirit and scope of the claimed subject matter.

Figure 2:
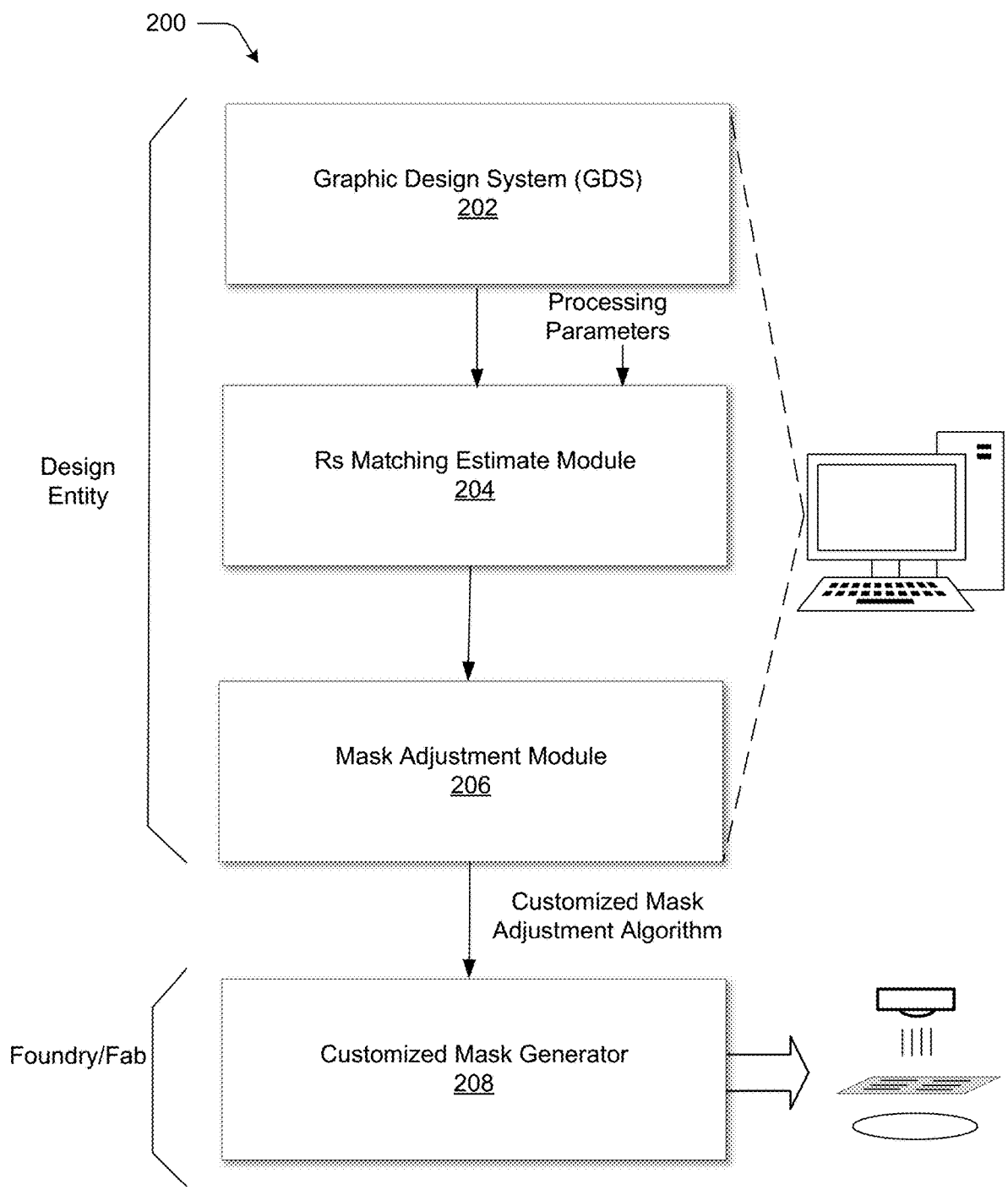
FIG. 2 illustrates a design system in accordance with one or more embodiments.

In the embodiments about to be described, a system is utilized to employ various resistor modification operations in order to ensure that fabricated resistor structures have a desired sheet resistance Rs within design tolerances. One such system is shown in FIG. 2, generally at 200.

In the illustrated and described embodiments, system 200 includes one or more computing devices that include a Graphic Design System (GDS) 202, a Sheet Resistance (Rs) Matching Estimate Module 204, a Mask Adjustment Module 206, and a Customized Mask Generator 208. Typically, a design entity, such as an entity that formulates semiconductor design layouts, employs the Graphic Design System (GDS) 202, Sheet Resistance (Rs) Matching Estimate Module 204, and Mask Adjustment Module 206. A foundry or semiconductor fabrication entity then employs the Customized Mask Generator 208 to process the customized mask adjustment algorithm produced by the Mask Adjustment Module 206, as described below in more detail. The computing device includes one or more processors, computer-readable storage media, and computer-executable instructions stored on the computer-readable storage media that are executable by the processors to implement functionality described herein. The Graphic Design System (GDS) 202, Sheet Resistance (Rs) Matching Estimate Module 204, Mask Adjustment Module 206, and Customized Mask Generator 208 can be implemented in connection with any suitable hardware, software, firmware or combination thereof.

The Graphic Design System (GDS) 202 is employed to create a semiconductor design layout in accordance with various design parameters. The GDS 202 is typically a computer-based, electronic design automation (EDA) tool that can create a file that defines the layout of a particular semiconductor design. This enables the design to be tested before manufacturing the corresponding semiconductor device. The EDA tool is typically embodied as one or more sets of executable instructions for execution by a processor or controller or a program's computer to perform the indicated functionality.

The Rs Matching Estimate Module 204 is used to test the layout defined by the GDS 202. That is, the Rs Matching Estimate Module 204 receives processing parameters associated with a particular foundry or processing technology, and then calculates whether the processing parameters when utilized with the design layout, will result in an end product that meets the design parameters associated with the layout.

The Mask Adjustment Module 206 is used to generate a customized mask adjustment algorithm in the event adjustments need to be made to one or more masks in order to meet the design parameters associated with the design layout. In this particular instance, the customized mask adjustments to be made by the customized mask adjustment algorithm are used to create one or more masks to enable resistor structures to be fabricated that have the desired sheet resistance Rs.

The customized mask adjustment algorithm is then used by a foundry or a fabrication entity and a suitably-configured Customized Mask Generator 208 to generate masks which are then used in the fabrication process to produce memory circuitry having resistor structures that have the desired sheet resistance Rs.

Having considered an example system in accordance with one or more embodiments, consider now operations that can be implemented by the system just described.

Figure 3:
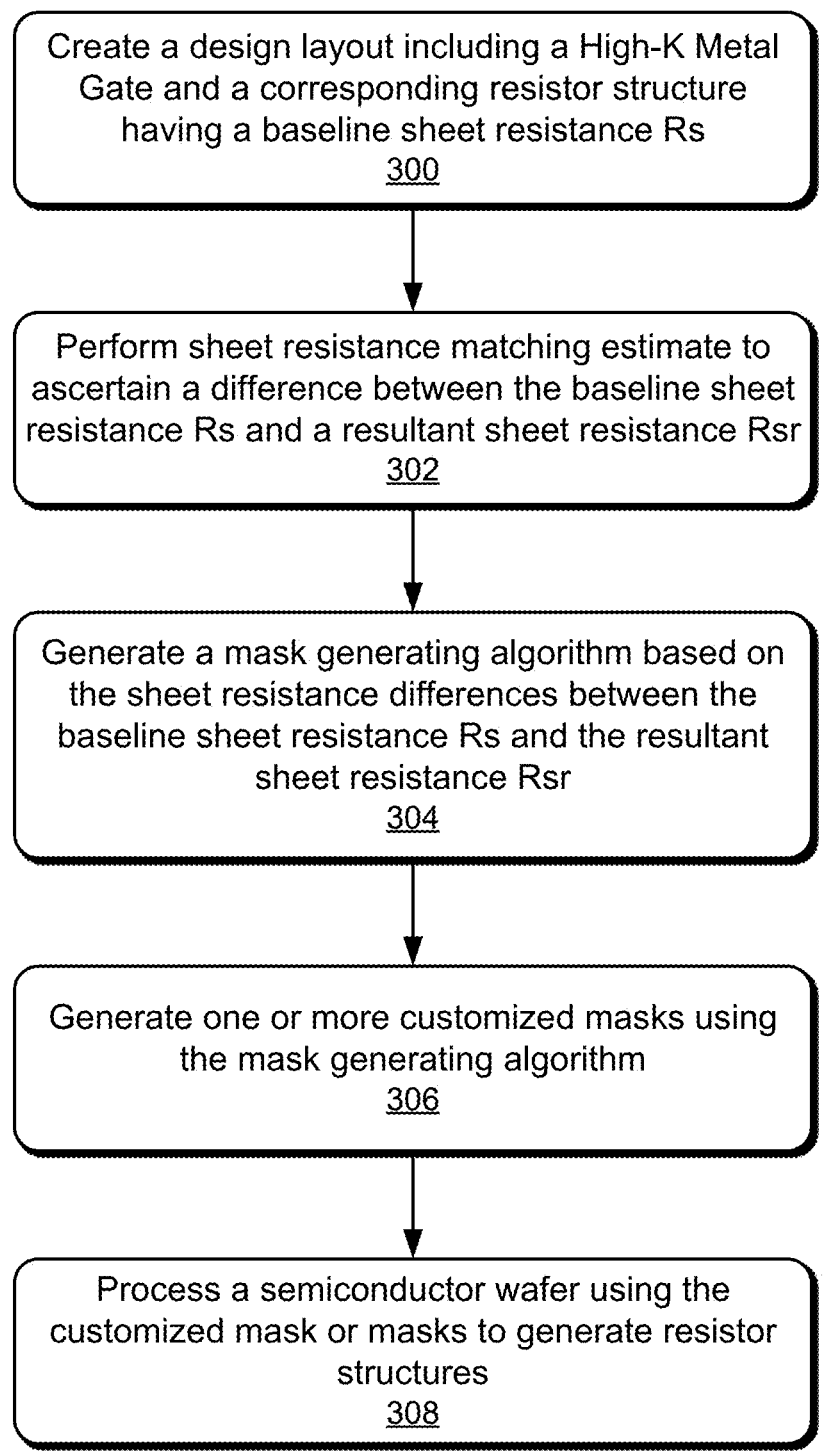
FIG. 3 is a flow diagram that describes operations in accordance with one or more embodiments.

FIG. 3 is a flow diagram that describes operations in accordance with one or more embodiments. The operations can be performed in accordance with any suitable hardware, software, firmware, or combination thereof. In at least some embodiments, aspects of the method can be performed by a design entity, such as an entity that creates semiconductor layout designs using components such as Graphic Design System (GDS) 202, a Sheet Resistance (Rs) Matching Estimate Module 204, and Mask Adjustment Module 206 (FIG. 2). Other aspects of the method can be performed by a foundry or a fabrication entity that fabricates semiconductor devices using, in part, Customized Mask Generator 208 (FIG. 2).

At 300, a design layout is created including a High-K Metal Gate, e.g., a gate-last High-K Metal Gate, and a corresponding resistor structure having a designed sheet resistance Rs, referred to as the "baseline sheet resistance". Although the examples described in this document utilize a gate-last scenario, the innovative techniques can be utilized in other processes, such as gate-first processes, as well as others, without departing from the spirit and scope of the claimed subject matter. The operation at 300 can be performed by Graphic Design System (GDS) 202 (FIG. 2). The design layout includes a resistor marker layer over the resistor structure, examples of which are provided below. The resistor marker layer is utilized to perform resistor modifications such as, by way of example and not limitation, serving as a point of reference to permit sizing adjustments to ensure that the mask or masks employed to form the final resistor structure results in the correct designed sheet resistance Rs. This operation can be performed in any suitable way such as, by way of example and not limitation, by creating a Graphic Design System (GDS) file using an electronic design automation (EDA) tool.

At 302, a sheet resistance matching estimate is performed to ascertain a difference between the baseline sheet resistance Rs and a resultant sheet resistance Rsr if the resistor structure were to be manufactured using a first manufacturing process. This operation can be performed by sheet resistance (Rs) matching estimate module 204 (FIG. 2). The sheet resistance matching estimate is conducted by comparing the baseline sheet resistance Rs to the resultant sheet resistance Rsr that would result if the design layout, as designed or "drawn", were to be used to form the resistor structure using certain manufacturing processing parameters. That is, in practice, the manufacturing processing parameters may be those associated with a particular foundry or processing technology and can include, by way of example and not limitation, processing equipment such as reactors, dopants, processing materials, processing conditions, and the like. Typically, these processing parameters can change and can be different from foundry-to-foundry and processing technology-to-processing technology. Because the processing parameters can change, so too can the resultant sheet resistance Rsr of a particular design layout.

Accordingly, at 304, a mask generating algorithm is generated based on the sheet resistance differences between the baseline sheet resistance Rs and the resultant sheet resistance Rsr effective to achieve a sheet resistance that is closer to the baseline sheet resistance Rs rather than the resultant sheet resistance Rsr. This operation can be performed by Mask Adjustment Module 206 (FIG. 2). Ideally, the sheet resistance that is achieved should be as close to the baseline sheet resistance as possible, within any relevant design tolerances. Generating the mask generating algorithm enables one or more masks to be generated to modify the structure of the resistor structure relative to the resistor marker layer. That is, as noted above, the resistor marker layer serves as a point of reference from which structure modifications are made.

At 306, one or more customized masks are generated using the mask generating algorithm. This operation can be performed by Customized Mask Generator 208 (FIG. 2). At 308, a semiconductor wafer is processed using the customized mask or masks to generate resistor structures having a sheet resistance that is closer to the baseline sheet resistance Rs, within acceptable design tolerances.

Consider now various specific resistor modifications that can be employed, including dimensional modifications, implantation modifications, and the like, to achieve a desired sheet resistance Rs close to or at the baseline sheet resistance. It is to be noted that the embodiments described below do not require the use of any additional masks that are typically used to fabricate the semiconductor devices.

Resistor Width Adjustments

Figure 4:
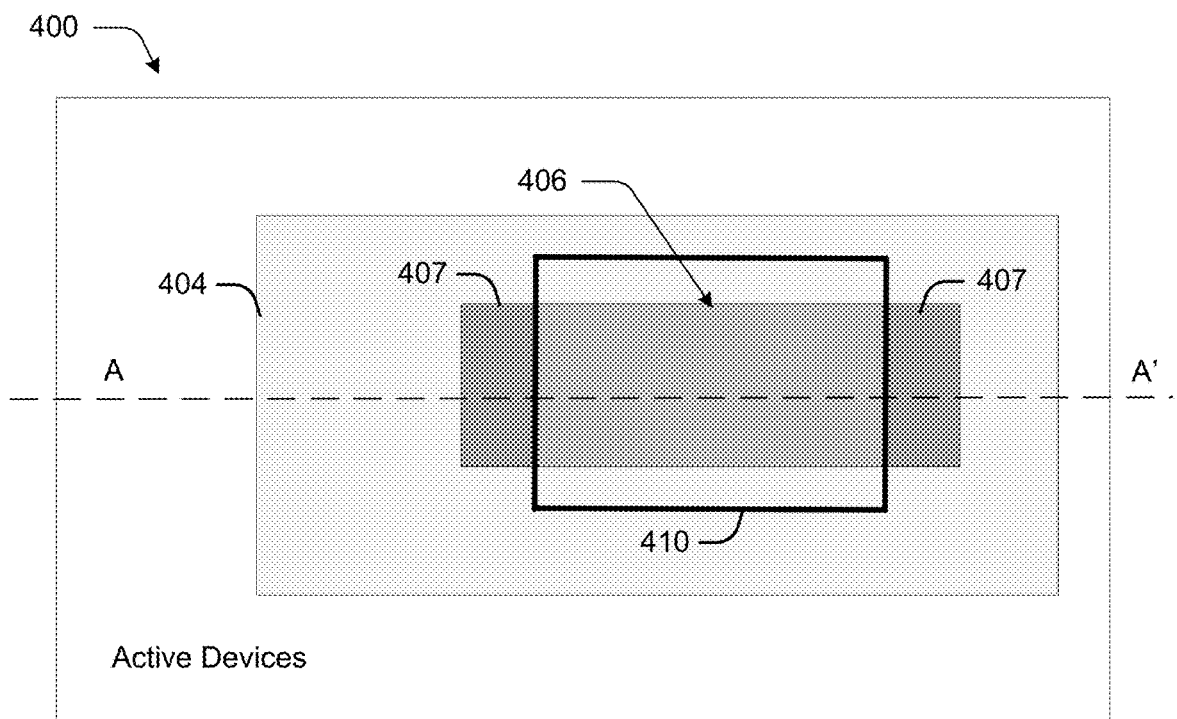
FIGS. 4 and 5 illustrate an example resistor width adjustment to achieve matching sheet resistance in accordance with one or more embodiments.

As an example, consider FIG. 4. There, an example Hi-K Metal Gate (HKMG) assembly 400 is illustrated as a gate-last HKMG assembly. HKMG assembly 400 includes active devices in an area 402 adjacent shallow trench isolation (STI) region 404. Formed over STI region 404 is a high precision resistor which, in this case, comprises an un-silicided polysilicon resistor 406 including two silicided end portions 407. The un-silicided polysilicon resistor 406 and corresponding end portions 407 are disposed atop a Hi-K protection metal or alloy layer and a Hi-K layer, as in the above example. In this example, a layout marker layer in the form of a resistor marker layer is illustrated at 410. In the illustrated and described example, the resistor marker layer 410 has a rectangular shape that is disposed over the un-silicided polysilicon resistor 406. Resistor marker layer 410 is used as a point of reference from which mask adjustments can be made to achieve a desired resultant sheet resistance.

Figure 5:
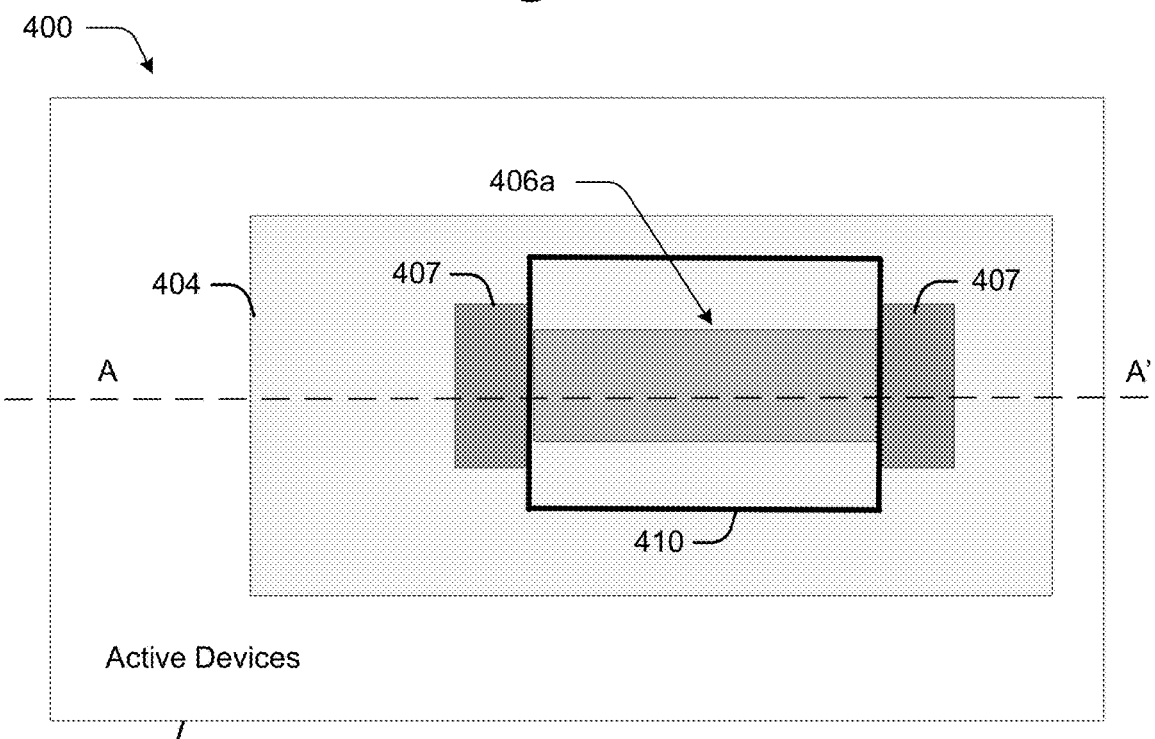

FIG. 5 further illustrates the example gate-last Hi-K Metal Gate (HKMG) assembly 400 in which the width of the resistor 406 (as shown in FIG. 4) is to be reduced depending on the Rs difference from that of the original process that defined gate-last Hi-K Metal Gate (HKMG) assembly 400 and the current process that is to be used create the gate-last Hi-K Metal Gate (HKMG) assembly 400. In this particular example, the difference between the baseline sheet resistance Rs and the resultant sheet resistance Rsr indicates that the width of the resistor 406a should be reduced in order to provide a higher sheet resistance. Notice that un-silicided polysilicon resistor 406a now has a reduced width relative to the resistor marker layer 410.

Figure 6:
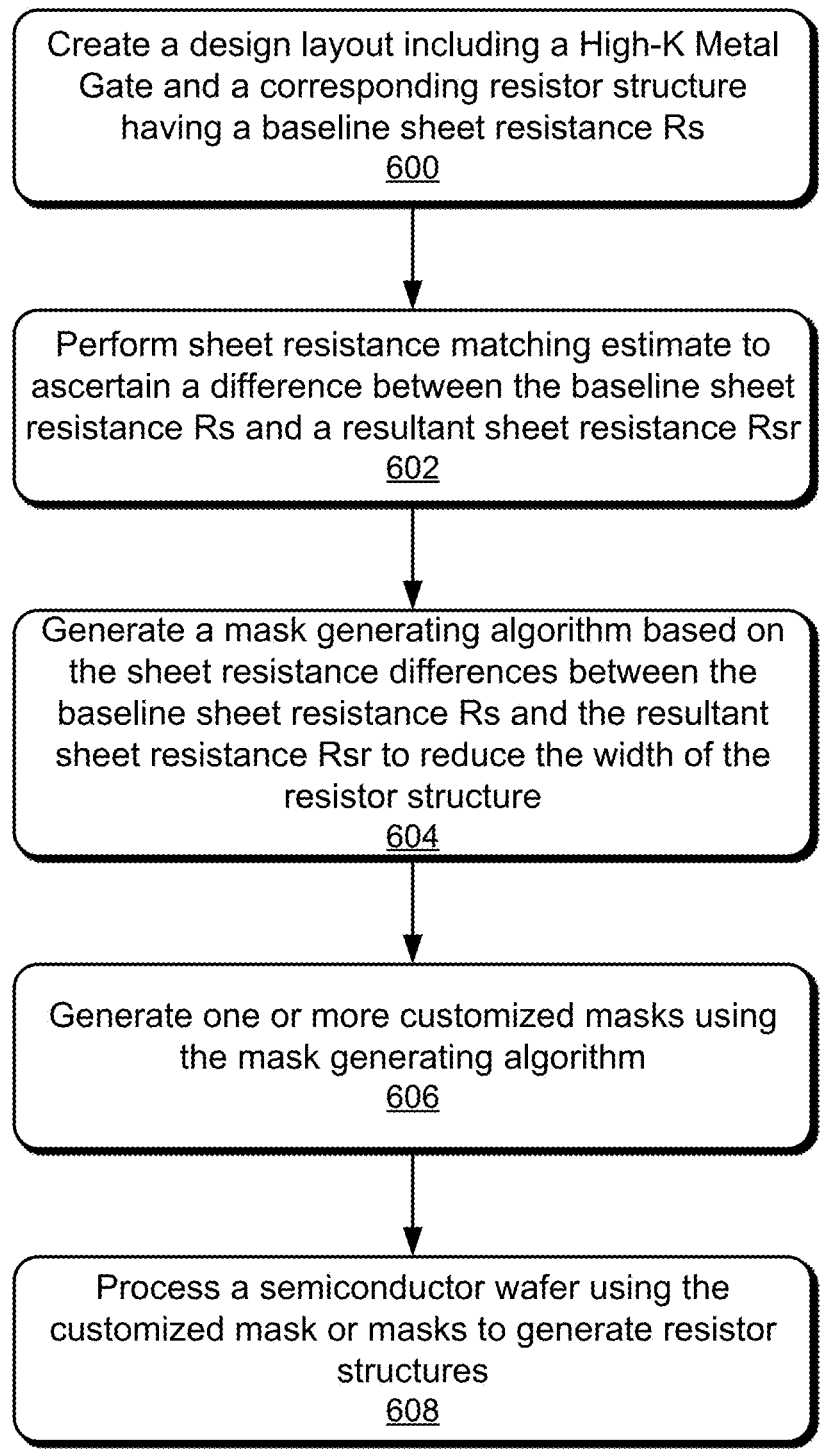
FIG. 6 is a flow diagram that describes operations in accordance with one or more embodiments.

FIG. 6 is a flow diagram that describes operations in accordance with one or more embodiments. The operations can be performed in accordance with any suitable hardware, software, firmware, or combination thereof. In at least some embodiments, aspects of the method can be performed by a design entity, such as an entity that creates semiconductor layout designs. Other aspects of the method can be performed by a foundry or a fabrication entity that fabricates semiconductor devices.

At 600, a design layout is created including a High-K Metal Gate, e.g., a gate-last High-K Metal Gate, and corresponding resistor structure having a designed sheet resistance Rs, referred to as the "baseline sheet resistance". The design layout includes a resistor marker layer over the resistor structure, examples of which are shown in FIGS. 4 and 5. The resistor marker layer is utilized to perform resistor modifications such as, by way of example and not limitation, serving as a point of reference to permit sizing adjustments to ensure that the final formed resistor has the correct designed sheet resistance Rs. This operation can be performed in any suitable way such as, by way of example and not limitation, by creating a Graphic Design System (GDS) file using an electronic design automation (EDA) tool.

At 602, a sheet resistance matching estimate is performed to ascertain a difference between the baseline sheet resistance Rs and a resultant sheet resistance Rsr if the resistor structure were to be manufactured using a first manufacturing process. The sheet resistance matching estimate is conducted by comparing the baseline sheet resistance Rs to the resultant sheet resistance Rsr that would result if the design layout, as designed or "drawn", were to be used to form the resistor structure using certain manufacturing processing parameters. That is, in practice, the manufacturing processing parameters may be those associated with a particular foundry and can include, by way of example and not limitation, processing equipment such as reactors, dopants, processing materials, processing conditions and the like. Typically, these processing parameters can change and can be different from foundry to foundry. Because the processing parameters can change from foundry to foundry, so too can the resultant sheet resistance Rsr of a particular design layout. So, for example, if the baseline sheet resistance Rs=1, and the resultant sheet resistance Rsr=0.5, a resistor modification process will be employed to achieve a higher sheet resistance when the resistor structure is manufactured. So, in this example, in order to achieve the baseline sheet resistance Rs=1, a formation algorithm, such as Logic Operation (LOP) or Optical Proximity Correction (OPC), will be utilized in the manufacturing flow to shrink the resistor's width by 0.5× in order to achieve an Rs match.

Accordingly, at 604 a mask generating algorithm is generated based on the sheet resistance differences between the baseline sheet resistance and the resultant sheet resistance effective to reduce the width of the resistor structure in order achieve a higher sheet resistance that is closer to the baseline sheet resistance Rs rather than the resultant sheet resistance Rsr. Ideally, the sheet resistance that is achieved should be as close to the baseline sheet resistance as possible, within any relevant design tolerances. Generating the mask generating algorithm enables one or more masks to be generated to modify the structure of the resistor structure relative to the resistor marker layer. That is, as noted above, the resistor marker layer serves as a point of reference from which structure modifications are made.

In one or more embodiments, the operations described at 600, 602, and 604 are performed by a design entity that creates and tests semiconductor layout designs. The operations described just below can be performed by a foundry or a fabrication entity that utilizes the mask generating algorithm generated by the design entity.

At 606, one or more customized masks are generated using the mask generating algorithm. At 608, a semiconductor wafer is processed using the customized mask or masks to generate resistor structures having a sheet resistance that is closer to the baseline sheet resistance Rs. It is to be appreciated and understood, that no extra masks are needed using this approach.

The embodiments described above and below work both with the High-K process, as illustrated in FIG. 1 above, and with traditional Poly/SiONx processes. In the traditional Poly/SiONx process case, no High-K protection metal or alloy is utilized. Accordingly, the conductance is mainly in polysilicon. The appropriate sizing of the polysilicon using the processes described above and below can realize sheet resistance matching in these traditional processes.

Consider now other resistor structure modifications that can be employed, using the resistor marker layer in order to achieve a designed sheet resistance.

Resistor Length Adjustments

The embodiment described just above can be utilized to size down the resistor structure's width to achieve a higher effective sheet resistance Rs in the foundry. In at least some embodiments, the effective sheet resistance Rs (as drawn) may need to be lower in order to match the baseline sheet resistance Rs. In this instance, the length of the resistor structure can be reduced. In order to reduce the length of the resistor structure, the length of the silicide block layer, i.e. the layer that is used to block the silicide process relative to the underlying polysilicon, can be modified—in this case reduced. In this instance, the mask that is used in the silicide process to form the un-silicided polysilicon resistor, e.g. resistor 106 (FIG. 1) can be modified. As an example, consider FIGS. 7 and 8.

Figure 7:
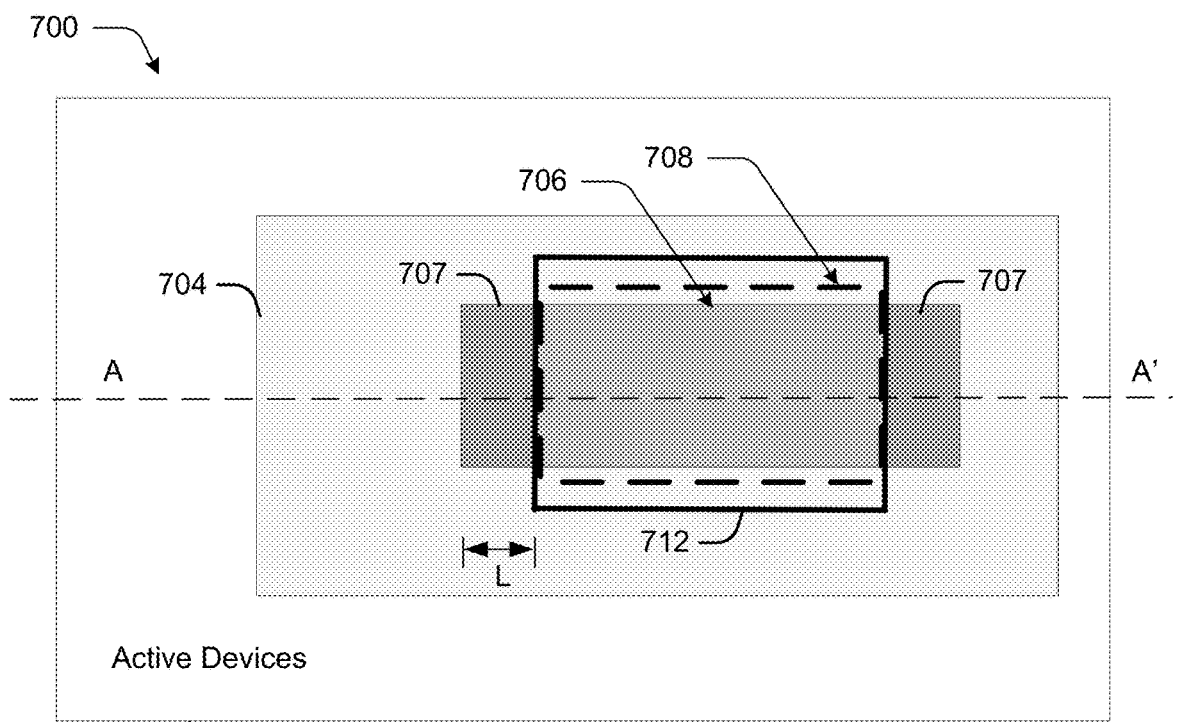
FIGS. 7 and 8 illustrate an example resistor length adjustment to achieve matching sheet resistance in accordance with one or more embodiments.

FIG. 7 illustrates an example Hi-K Metal Gate (HKMG) assembly 700 as a gate-last HKMG assembly. The HKMG assembly 700 includes active devices in an area 702 adjacent shallow trench isolation (STI) region 704. Formed over STI region 704 is a high precision resistor which, in this case, comprises an un-silicided polysilicon resistor 706 including two silicided end portions 707. The un-silicided polysilicon resistor 706 and corresponding end portions 707 in the form of silicided polysilicon are disposed atop a Hi-K protection metal or alloy layer and a Hi-K layer, as in the above example (FIG. 1). In this example, a silicide block layer is represented by the dashed line 708, and a layout marker layer in the form of a resistor marker layer is illustrated at 712.

Figure 8:
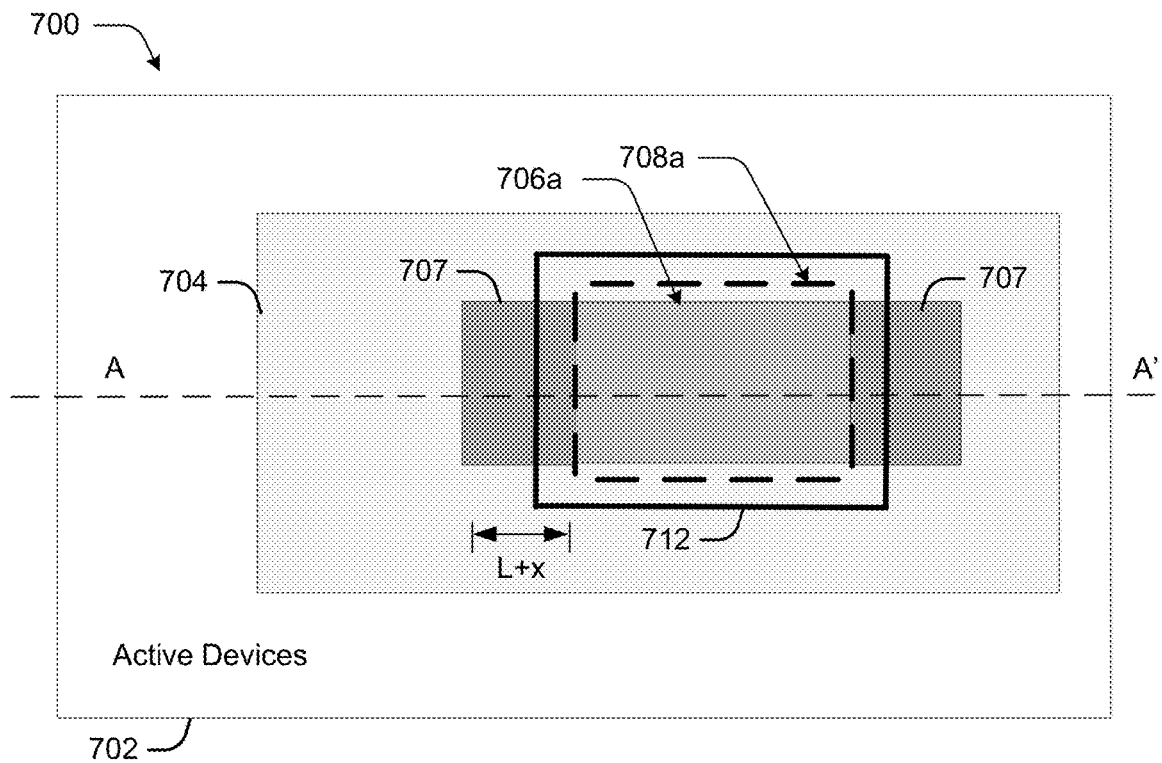

FIG. 8 further illustrates the example gate-last Hi-K Metal Gate (HKMG) assembly 700 in which the length of the resistor 706 (as shown in FIG. 7) is to be reduced depending on the Rs difference from that of the original process that defined the gate-last Hi-K Metal Gate (HKMG) assembly 700 and the current process that is to be used create the gate-last Hi-K Metal Gate (HKMG) assembly 700. In this particular example, reducing the length of the un-silicided polysilicon resistor 706 is achieved by reducing the length of the silicide block layer 708a that is used to block the underlying polysilicon material during the silicide process that results in the formation of silicided polysilicon portions 707. As an example, consider FIG. 8 in comparison with FIG. 7.

In FIG. 7, the silicided polysilicon portions 707 have a length L, while the corresponding portions in FIG. 8 have a length L+x. The increase in length of the silicided polysilicon portions 707 and corresponding decrease in length of un-silicided polysilicon resistor 706a is due to the fact that the silicide block layer 708a (i.e. the Resist Protection Oxide (RPO)) has been reduced by 2×, thus increasing the amount of polysilicon material that undergoes the silicide process in order to form silicided polysilicon portions 707.

Thus, since the effective Rs needs to be lower, the silicide block layer 708 (FIG. 7) is reduced in length in the mask generation flow to achieve a matching Rs. In the illustrated and described example, the factor for RPO length modulation coefficient is defined as Rs_current_new_process/Rs_baseline. Additionally, the dimensions on the corresponding mask will be changed by the original RPO length divided by the RPO length modulation coefficient. This is diagrammatically indicated in FIGS. 7 and 8.

Figure 9:
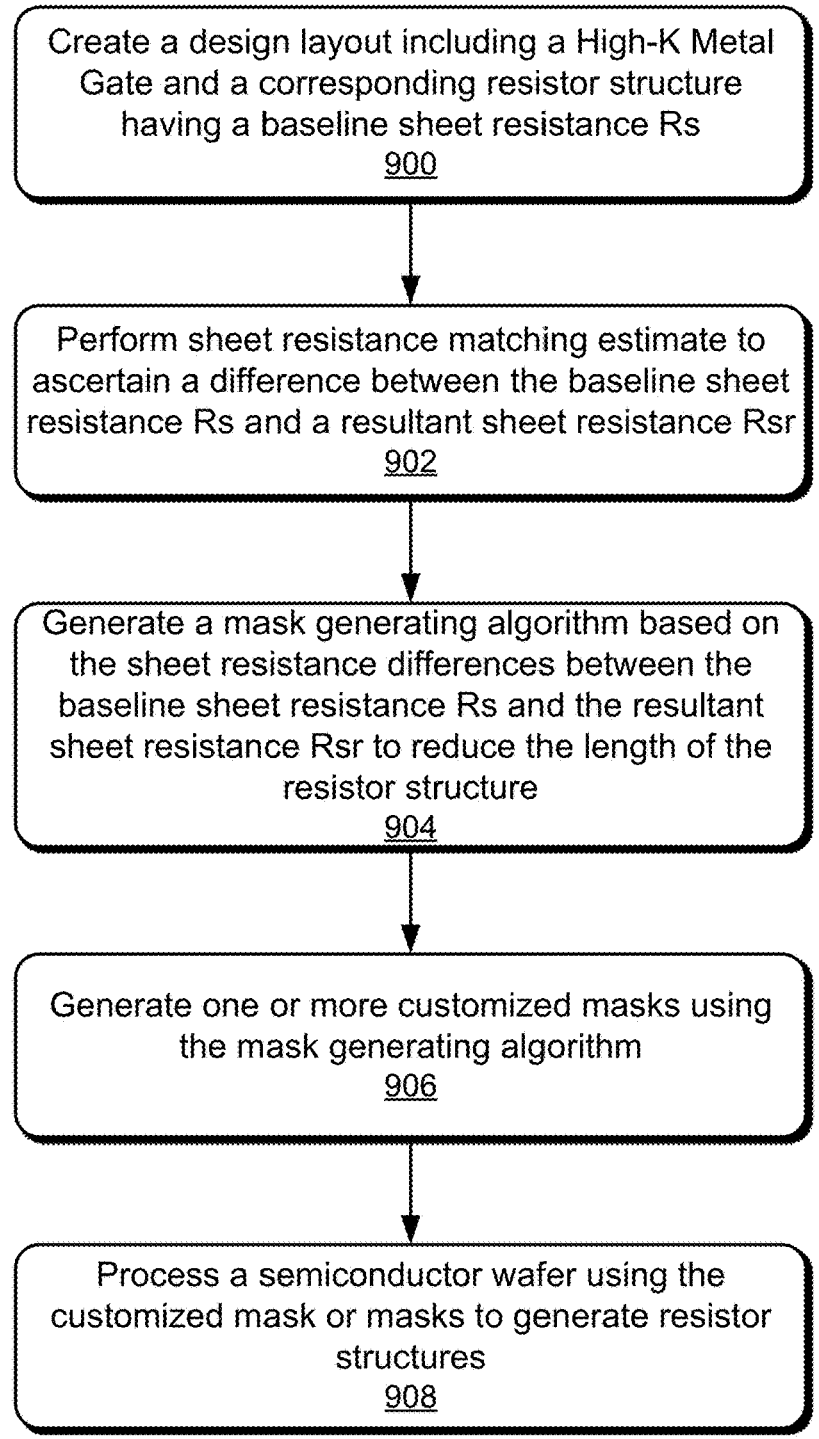
FIG. 9 is a flow diagram that describes operations in accordance with one or more embodiments.

FIG. 9 is a flow diagram that describes operations in accordance with one or more embodiments. The operations can be performed in accordance with any suitable hardware, software, firmware, or combination thereof.

At 900, a design layout is created including a High-K Metal Gate, e.g., a gate-last HKMG and corresponding resistor structure having a designed sheet resistance Rs, referred to as the "baseline sheet resistance". The design layout includes a resistor marker layer over the resistor structure, as in the above example. This operation can be performed in any suitable way such as, by way of example and not limitation, by creating a Graphic Design System (GDS) file using an electronic design automation (EDA) tool.

At 902, a sheet resistance matching estimate is performed to ascertain a difference between the baseline sheet resistance Rs and a resultant sheet resistance Rsr if the resistor structure were to be manufactured using a first manufacturing process. The sheet resistance matching estimate is conducted by comparing the baseline sheet resistance Rs to the resultant sheet resistance Rsr that would result if the design layout, as designed or "drawn", were to be used to form the resistor structure using certain manufacturing processing parameters. That is, in practice, the manufacturing processing parameters may be those associated with a particular foundry and can include, by way of example and not limitation, processing equipment such as reactors, dopants, processing materials, processing conditions and the like. Typically, these processing parameters can change and can be different from foundry to foundry. Because the processing parameters can change from foundry to foundry, so too can the resultant sheet resistance Rsr of a particular design layout. So, for example, if the baseline sheet resistance Rs=1, and the estimated sheet resistance Rs'=2, a resistor modification process will be employed. So, in this example, in order to achieve the baseline sheet resistance Rs=1, a formation algorithm, such as Logic Operation (LOP) or Optical Proximity Correction (OPC), that is utilized in the manufacturing flow will shrink the length of the resist protection oxide (ROP) by 2× in order to achieve an Rs match.

Accordingly, at 904 a mask generating algorithm is generated based on the sheet resistance differences between the baseline sheet resistance and the resultant sheet resistance effective to reduce the length of the silicide blocking layer in order reduce the length of the resistor structure which, in turn, achieves a lower sheet resistance that is closer to the baseline sheet resistance Rs rather than the resultant sheet resistance Rsr. Ideally, the sheet resistance that is achieved should be as close to the baseline sheet resistance as possible, within any relevant design tolerances. Generating the mask generating algorithm enables one or more masks to be generated to modify the structure of the resistor structure relative to the resistor marker layer. That is, as noted above, the resistor marker layer serves as a point of reference from which structure modifications are made. In one or more embodiments, the operations described at 900, 902, and 904 are performed by a design entity that creates and tests semiconductor layout designs. The operations described just below can be performed by a foundry or a fabrication entity that utilizes the mask generating algorithm generated by the design entity.

At 906, one or more customized masks are generated using the formation algorithm. In this particular example, the mask or masks that are generated are used to form the silicide blocking layer, i.e., the RPO mask. At 908, a semiconductor wafer is processed using the customized mask or masks to generate resistor structures having the designed sheet resistance Rs. It is to be appreciated and understood, that no extra masks are needed using this approach.

The embodiments described above and below work both with the High-K process, as illustrated in FIG. 1 above, and with traditional Poly/SiONx processes. In the traditional Poly/SiONx process case, no High-K protection metal or alloy is utilized. Accordingly, the conductance is mainly in polysilicon. The appropriate sizing of the polysilicon using the processes described above and below can realize sheet resistance matching in these traditional processes.

Figure 10:
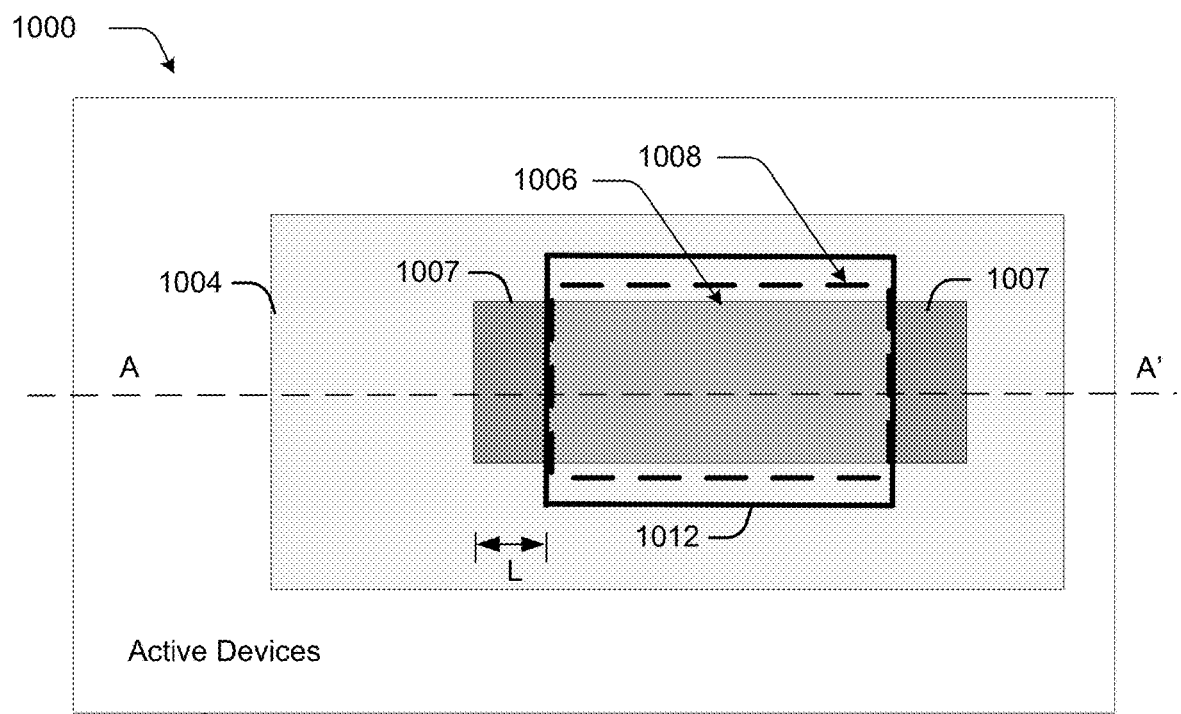
FIGS. 10 and 11 illustrate an example resistor segmentation process to achieve matching sheet resistance in accordance with one or more embodiments.
Figure 11:
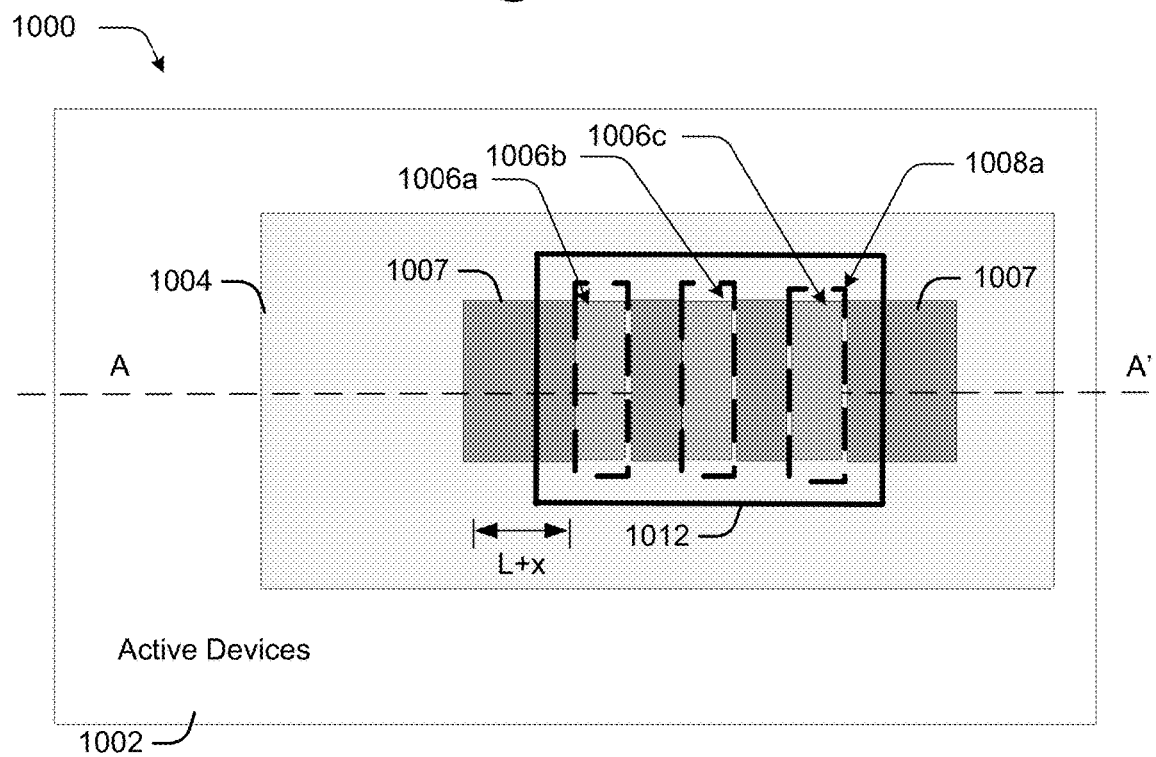

In addition to adjusting polysilicon width, as in FIGS. 4 and 5, and RPO length, as in FIGS. 7 and 8, various embodiments can also achieve a matching sheet resistance Rs by segmenting the Resist Protection Oxide (RPO) as shown in FIGS. 10 and 11 below, or adjusting the ion implantation width as shown in FIGS. 13, 14 and 15, 16.

Segmenting the Resist Protection Oxide (RPO)

FIG. 10 illustrates an example Hi-K Metal Gate (HKMG) assembly 1000 as a gate-last HKMG assembly. The HKMG assembly 1000 includes active devices in an area 1002 adjacent shallow trench isolation (STI) region 1004. Formed over STI region 1004 is a high precision resistor which, in this case, comprises an un-silicided polysilicon resistor 1006 including two silicided end portions 1007. The un-silicided polysilicon resistor 1006 and corresponding end portions 1007 in the form of silicided polysilicon are disposed atop a Hi-K protection metal or alloy layer and a Hi-K layer, as in the above example (FIG. 1). In this example, a silicide block layer is represented by the dashed line 1008, and a layout marker layer in the form of a resistor marker layer is illustrated at 1012. In the illustrated and described example, the resistor marker layer 1012 has a rectangular shape that is disposed over the un-silicided polysilicon resistor 1006.

FIG. 11 further illustrates the example gate-last Hi-K Metal Gate (HKMG) assembly 1000 in which the dimensions of the resistor 1006 (as shown in FIG. 10) are to be reduced depending on the Rs difference from that of the original process that defined the gate-last Hi-K Metal Gate (HKMG) assembly 1000 and the current process that is to be used create the gate-last Hi-K Metal Gate (HKMG) assembly 1000. In this particular example, modifying the dimensions of the un-silicided polysilicon resistor is achieved by segmenting the silicide block layer that is used to block the underlying polysilicon material during the silicide process that results in the formation of silicided polysilicon portions 1007. As an example, consider FIG. 11 in comparison with FIG. 10.

In FIG. 10, silicided polysilicon portions 1007 have a length L, while the corresponding portions in FIG. 11 have a length L+x. The increase in length of the silicided polysilicon portions 1007 and corresponding decrease in length of un-silicide polysilicon resistor 1006 is due to the fact that the silicide block layer (i.e. the Resist Protection Oxide (RPO)) has been reduced, thus increasing the amount of polysilicon material that undergoes the silicide process in order to form silicided polysilicon portions 1007. In addition, the RPO has been segmented to form, in this example, three segments which correspond to un-silicided polysilicon resistor portions 1006*a*, 1006*b*, and 1006*c*. Thus, since the effective Rs needs to be lower, the silicide block layer is reduced in length and segmented in the mask generation flow to achieve a matching Rs.

Figure 12:
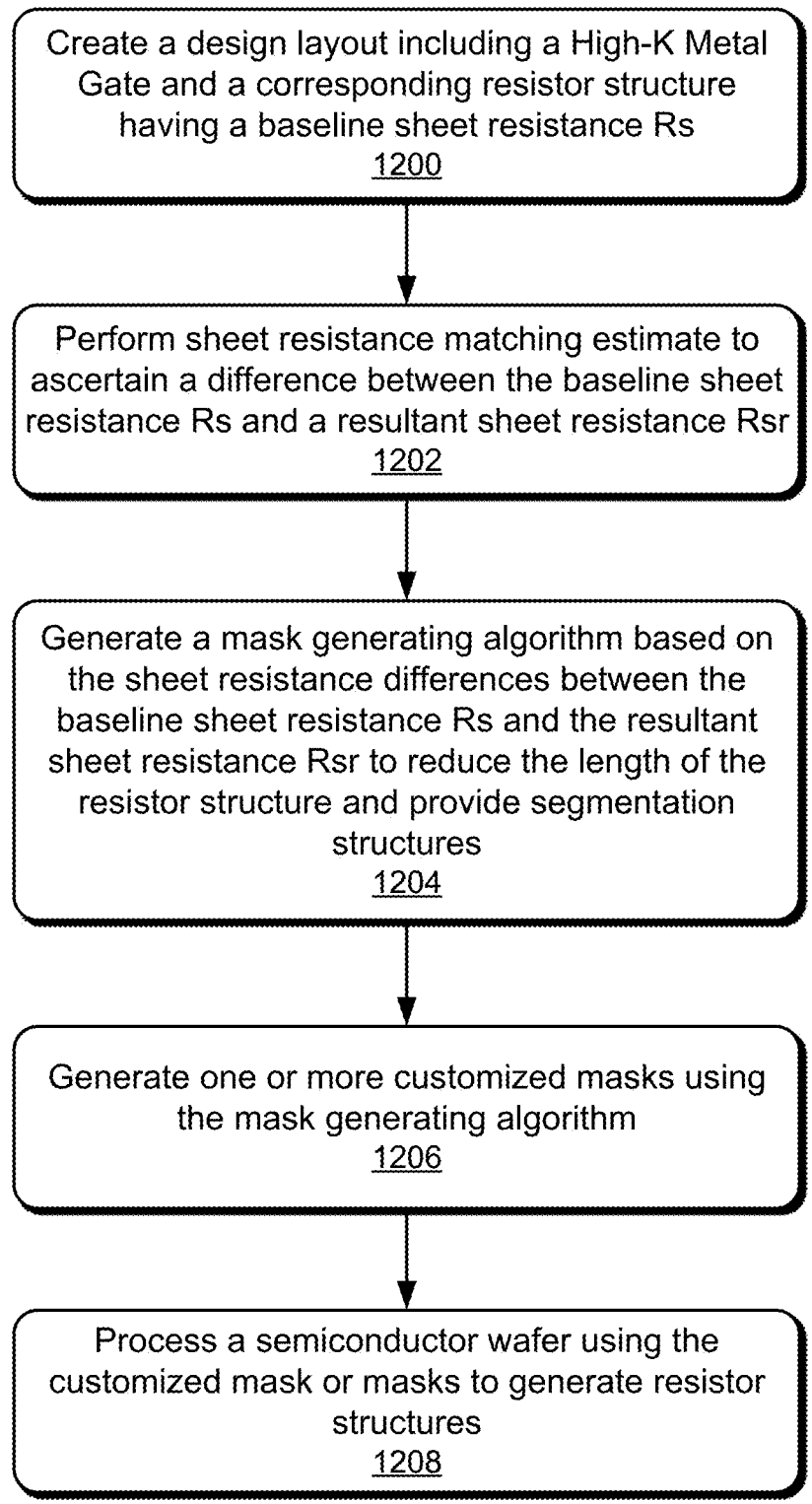
FIG. 12 is a flow diagram that describes operations in accordance with one or more embodiments.

FIG. 12 is a flow diagram that describes operations in accordance with one or more embodiments. The operations can be performed in accordance with any suitable hardware, software, firmware, or combination thereof.

At 1200, a design layout is created including a High-K Metal Gate, e.g., a gate-last HKMG and corresponding resistor structure having a designed sheet resistance Rs, referred to as the "baseline sheet resistance". The design layout includes a resistor marker layer over the resistor structure, as in the above example. This operation can be performed in any suitable way such as, by way of example and not limitation, by creating a Graphic Design System (GDS) file using an electronic design automation (EDA) tool. At 1202, a sheet resistance matching estimate is performed to ascertain a difference between the baseline sheet resistance Rs and a resultant sheet resistance Rsr if the resistor structure were to be manufactured using a first manufacturing process. The sheet resistance matching estimate is conducted by comparing the baseline sheet resistance Rs to the resultant sheet resistance Rsr that would result if the design layout, as designed or "drawn", were to be used to form the resistor structure using certain manufacturing processing parameters. That is, in practice, the manufacturing processing parameters may be those associated with a particular foundry and can include, by way of example and not limitation, processing equipment such as reactors, dopants, processing materials, processing conditions and the like. Typically, these processing parameters can change and can be different from foundry to foundry. Because the processing parameters can change from foundry to foundry, so too can the resultant sheet resistance Rsr of a particular design layout. So, for example, if the baseline sheet resistance Rs=1, and the estimated sheet resistance Rs'=4, a resistor modification process will be employed. So, in this example, in order to achieve the baseline sheet resistance Rs=1, a formation algorithm, such as Logic Operation (LOP) or Optical Proximity Correction (OPC), that is utilized in the manufacturing flow will shrink the length of the resist protection oxide (ROP) and segment the ROP in order to achieve an Rs match.

Accordingly, at 1204 a mask generating algorithm is generated based on the sheet resistance differences between the baseline sheet resistance and the resultant sheet resistance effective to reduce the length of the silicide blocking layer in order reduce the length of the resistor structure and provide the segmentation structures described above. This, in turn, achieves a lower sheet resistance that is closer to the baseline sheet resistance Rs rather than the resultant sheet resistance Rsr. Ideally, the sheet resistance that is achieved should be as close to the baseline sheet resistance as possible, within any relevant design tolerances. Generating the mask generating algorithm enables one or more masks to be generated to modify the structure of the resistor structure and to provide the segmentation structures relative to the resistor marker layer. That is, as noted above, the resistor marker layer serves as a point of reference from which structure modifications are made. In one or more embodiments, the operations described at 1200, 1202, and 1204 are performed by a design entity that creates and tests semiconductor layout designs. The operations described just below can be performed by a foundry or a fabrication entity that utilizes the mask generating algorithm generated by the design entity.

At 1206, one or more customized masks are generated using the formation algorithm. In this particular example, the mask or masks that are generated are used to form the silicide blocking layer, i.e., the RPO mask. At 1208, a semiconductor wafer is processed using the customized mask or masks to generate resistor structures having the designed sheet resistance Rs. It is to be appreciated and understood, that no extra masks are needed using this approach.

The embodiments described above and below work both with the High-K process, as illustrated in FIG. 1 above, and with traditional Poly/SiONx processes. In the traditional Poly/SiONx process case, no High-K protection metal or alloy is utilized. Accordingly, the conductance is mainly in polysilicon. The appropriate sizing of the polysilicon using the processes described above and below can realize sheet resistance matching in these traditional processes.

Adjusting the Ion Implantation Width

Figure 13:
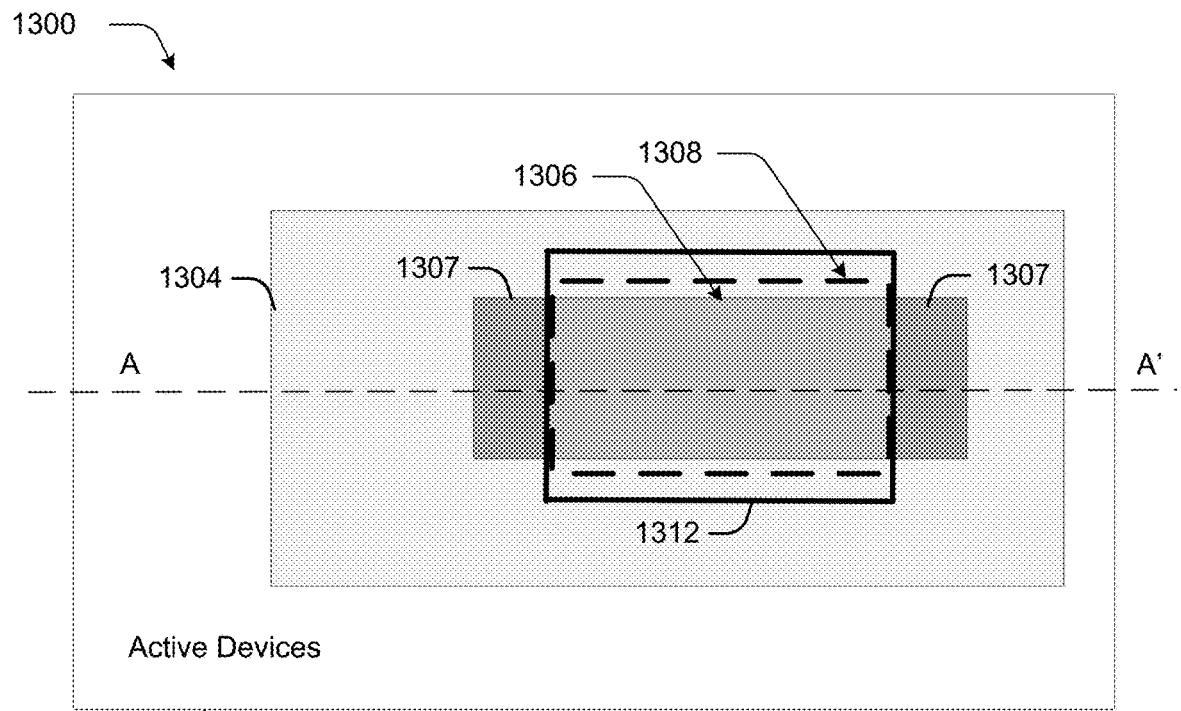
FIGS. 13 and 14 illustrate an example resistor ion implantation process to achieve matching sheet resistance in accordance with one or more embodiments.

FIG. 13 illustrates an example Hi-K Metal Gate (HKMG) assembly 1300 as a gate-last HKMG assembly. The HKMG assembly 1300 includes active devices in an area 1302 adjacent shallow trench isolation (STI) region 1304. Formed over STI region 1304 is a high precision resistor which, in this case, comprises an un-silicided polysilicon resistor 1306 including two silicided end portions 1307. The un-silicided polysilicon resistor 1306 and corresponding end portions 1307 in the form of silicided polysilicon are disposed atop a Hi-K protection metal or alloy layer and a Hi-K layer, as in the above example (FIG. 1). In this example, a silicide block layer is represented by the dashed line 1308, and a layout marker layer in the form of a resistor marker layer is illustrated at 1312. In the illustrated and described example, the resistor marker layer 1312 has a rectangular shape that is disposed over the un-silicided polysilicon resistor 1306.

Figure 14:
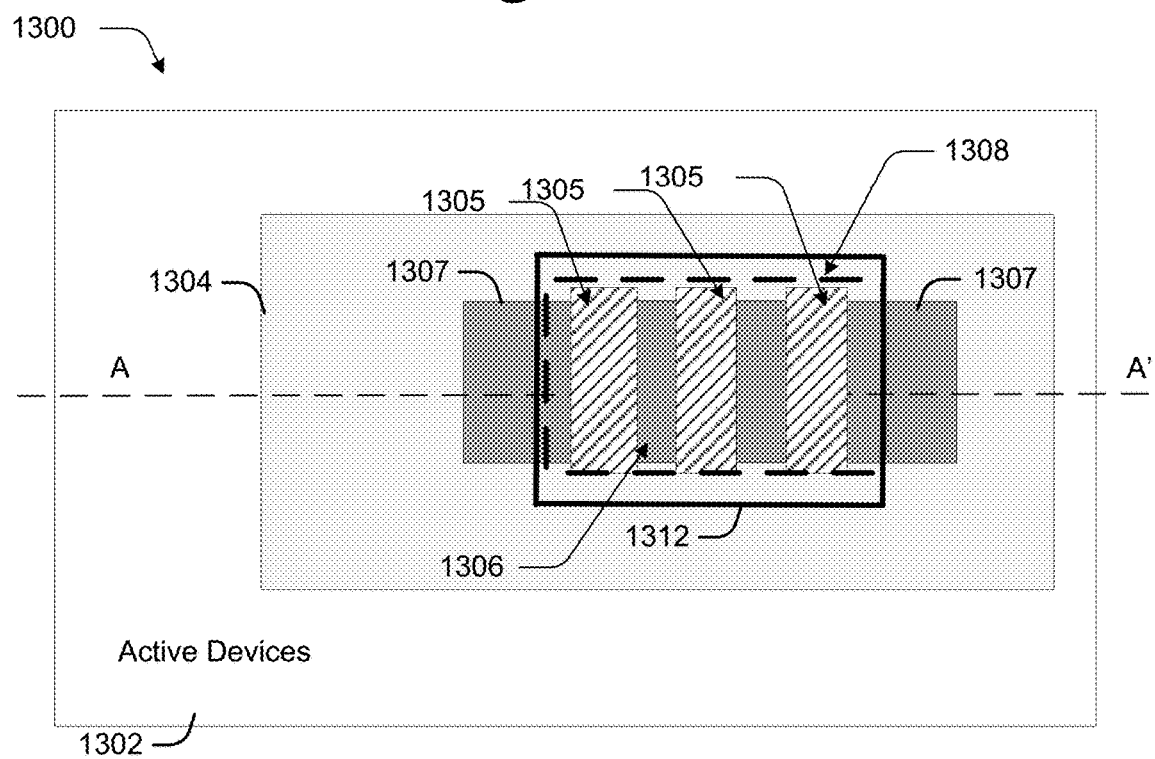

FIG. 14 further illustrates the example gate-last Hi-K Metal Gate (HKMG) assembly 1300 in which an ion implant mask 1305 is to be used to match the sheet resistance depending on the Rs difference from that of the original process that defined gate-last Hi-K Metal Gate (HKMG) assembly 1300 and the current process that is to be used create the gate-last Hi-K Metal Gate (HKMG) assembly 1300. In this particular example, modifying the resistance is achieved by ion implantation through mask 1305 to implant the underlying un-silicided polysilicon resistor 1306

Figure 15:
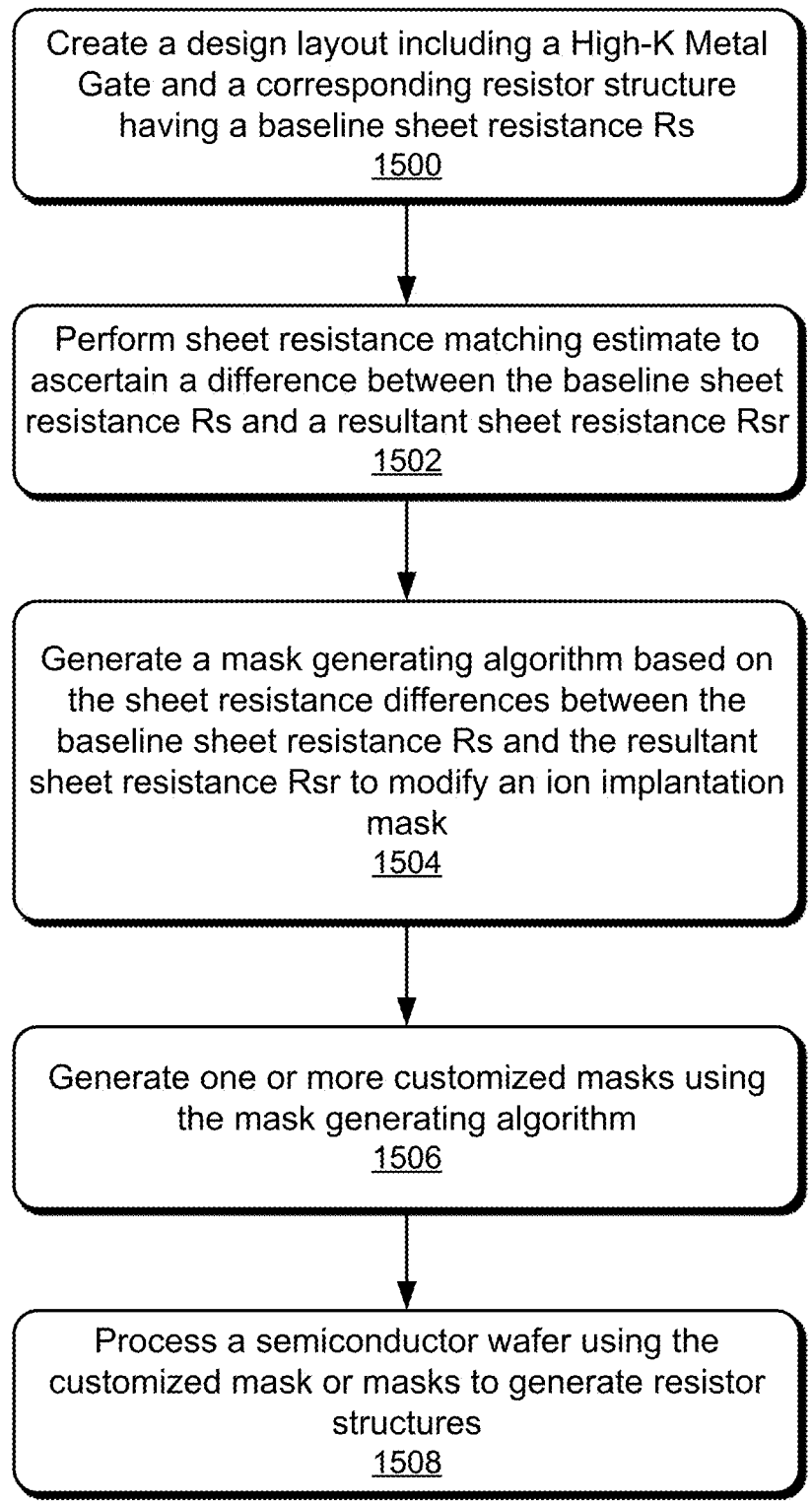
FIG. 15 is a flow diagram that describes operations in accordance with one or more embodiments.

FIG. 15 is a flow diagram that describes operations in accordance with one or more embodiments. The operations can be performed in accordance with any suitable hardware, software, firmware, or combination thereof.

At 1500, a design layout is created including a High-K Metal Gate, e.g., a gate-last HKMG corresponding resistor structure having a designed sheet resistance Rs, referred to as the "baseline sheet resistance". The design layout includes a resistor marker layer over the resistor structure, as in the above example. This operation can be performed in any suitable way such as, by way of example and not limitation, by creating a Graphic Design System (GDS) file using an electronic design automation (EDA) tool.

At 1502, a sheet resistance matching estimate is performed to ascertain a difference between the baseline sheet resistance Rs and a resultant sheet resistance Rsr if the resistor structure were to be manufactured using a first manufacturing process. The sheet resistance matching estimate is conducted by comparing the baseline sheet resistance Rs to the resultant sheet resistance Rsr that would result if the design layout, as designed or "drawn", were to be used to form the resistor structure using certain manufacturing processing parameters. That is, in practice, the manufacturing processing parameters may be those associated with a particular foundry and can include, by way of example and not limitation, processing equipment such as reactors, dopants, processing materials, processing conditions and the like. Typically, these processing parameters can change and can be different from foundry to foundry. Because the processing parameters can change from foundry to foundry, so too can the resultant sheet resistance Rsr of a particular design layout.

At 1504 a mask generating algorithm is generated based on the sheet resistance differences between the baseline sheet resistance and the resultant sheet resistance effective to modify an ion implantation mask to provide multiple openings over the un-silicided polysilicon resistor. This, in turn, allows ion implantation to achieves a sheet resistance that is closer to the baseline sheet resistance Rs rather than the resultant sheet resistance Rsr. Ideally, the sheet resistance that is achieved should be as close to the baseline sheet resistance as possible, within any relevant design tolerances. Generating the mask generating algorithm enables one or more masks to be generated to modify the ion implantation process or, more accurately, where ion implantation occurs relative to the resistor marker layer. That is, as noted above, the resistor marker layer serves as a point of reference from which modifications are made. In one or more embodiments, the operations described at 1500, 1502, and 1504 are performed by a design entity that creates and tests semiconductor layout designs. The operations described just below can be performed by a foundry or a fabrication entity that utilizes the mask generating algorithm generated by the design entity.

At 1506, one or more customized masks are generated using the formation algorithm. In this particular example, the mask or masks that are generated are used to conduct ion implantation, i.e., the ion implantation mask. At 1508, a semiconductor wafer is processed using the customized mask or masks to generate resistor structures having the designed sheet resistance Rs. It is to be appreciated and understood, that no extra masks are needed using this approach.

Figure 16:
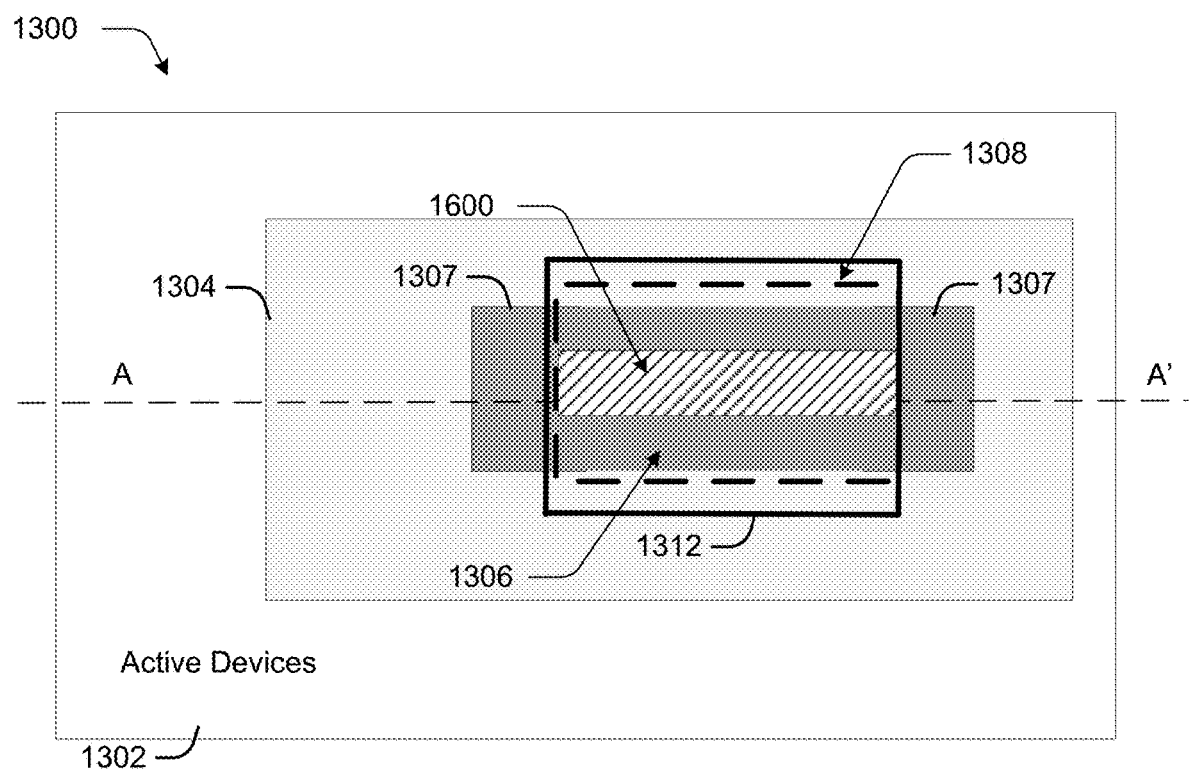
FIG. 16 illustrates an example resistor ion implantation process to achieve matching sheet resistance in accordance with one or more embodiments.

FIG. 16 illustrates a different, modified ion implantation mask 1600. Like numerals from FIGS. 13 and 14 are utilized to depict like components. In this instance, the modified mask, which is generated using a process such as that described in FIG. 15, runs the length of the un-silicided polysilicon resistor 1306. Other modified ion implantation mask configurations can be utilized without departing from the spirit and scope of the claimed subject matter.

The various embodiments described above provide benefits over previous approaches in a number of different ways. First, by modulating the resistor width and/or length instead of changing the implant dose and/or using extra masks to remove the bottom conducting layer, the process complexity is greatly reduced in forming the resistor as a parasitic process. Second, by conceiving and implementing the innovative resistor marker layer, different processes can be matched with significantly different intrinsic Rs through appropriately customized and clearly defined logic operations or optical proximity correction. In the illustrated and described embodiments, a rule of thumb is that a resistor width modulation coefficient should be equal to Rs_current-_new_process/Rs_baseline. Dimensions on masks can be changed by the original resistor with multiply by the resistor width modulation coefficient. It is to be appreciated and understood that the resistor width modulation coefficient can be less than, equal to, or greater than 1.

The various embodiments can reduce chip manufacturing complexity as well as mask and wafer costs and thusly, can improve yield and manufacturability. More importantly, the embodiments significantly improve memory chip portability between various foundries or manufacturing suppliers which, in turn, provides a significant advantage to so-called "fabless" design houses. The embodiments reduce or otherwise minimize resistor mask addition and simplify the chip manufacturing process flow by providing design methods to achieve matching of the effective sheet resistance Rs in different foundries. In addition, the above-described approach is scalable as technology becomes more and more advanced.

Although the subject matter has been described in language specific to structural features and/or methodological operations, it is to be understood that the subject matter defined in the appended claims is not necessarily limited to the specific features or operations described herein, including orders in which they are performed.

What is claimed is:

1. A method comprising:
creating, using a semiconductor design system, a semiconductor layout comprising a resistor structure, the resistor structure having a defined baseline sheet resistance, the semiconductor layout including a resistor marker layer over the resistor structure;
performing, using the semiconductor design system, a sheet resistance matching estimate to ascertain a difference between the baseline sheet resistance and a resultant sheet resistance if the resistor structure were to be manufactured using a manufacturing process; and
generating, using the semiconductor design system, a mask generating algorithm based on the difference effective to achieve a sheet resistance of the resistor structure that is closer to the baseline sheet resistance rather than the resultant sheet resistance, the generating enabling one or more masks to be generated to modify the resistor structure relative to the resistor marker layer by segmenting the resistor structure defined by the semiconductor layout into individual segmentation structures.

2. The method as recited in claim 1, wherein to modify the resistor structure relative to the resistor marker layer further comprises modifying a width of the resistor structure or to reduce the width of the resistor structure.

3. The method as recited in claim 1, wherein to modify the resistor structure relative to the resistor marker layer further comprises modifying a length of the resistor structure or reducing the length of the resistor structure.

4. The method as recited in claim 1, wherein the one or more masks comprise a mask useful to conduct a silicide process to form the resistor structure.

5. The method as recited in claim 1, wherein the individual segmentation structures into which the resistor structure is divided are rectangular in shape.

6. The method as recited in claim 1, wherein the one or more masks comprise an ion implantation mask useful to conduct ion implantation to form the resistor structure.

7. The method as recited in claim 1, wherein the semiconductor layout includes a gate-last, high-K metal gate device structure located adjacent the resistor structure.

8. A method comprising:
creating, using a semiconductor design system, a semiconductor layout comprising a high-K metal gate and a resistor structure, the resistor structure having a defined baseline sheet resistance, the semiconductor layout including a resistor marker layer over the resistor structure;
performing, using the semiconductor design system, a sheet resistance matching estimate to ascertain a difference between the baseline sheet resistance and a resultant sheet resistance if the resistor structure were to be manufactured using a manufacturing process; and
generating, using the semiconductor design system, a mask generating algorithm based on the difference effective to achieve a sheet resistance of the resistor structure that is closer to the baseline sheet resistance rather than the resultant sheet resistance, the generating enabling one or more masks to be generated to modify the resistor structure relative to the resistor marker layer by segmenting the resistor structure defined by the semiconductor layout into individual segmentation structures.

9. The method as recited in claim 8, wherein to modify the resistor structure relative to the resistor marker layer further comprises modifying a width of the resistor structure or reducing the width of the resistor structure.

10. The method as recited in claim 8, wherein to modify the resistor structure relative to the resistor marker layer further comprises modifying a length of the resistor structure or reducing the length of the resistor structure.

11. The method as recited in claim 8, wherein the one or more masks comprise a mask useful to conduct a silicide process to form the resistor structure.

12. The method as recited in claim 8, wherein the individual segmentation structures into which the resistor structure is divided are rectangular in shape.

13. The method as recited in claim 8, wherein the one or more masks comprise an ion implantation mask used to conduct ion implantation to form the resistor structure.

14. An apparatus comprising:
one or more hardware-based processors;
computer-readable storage media storing processor-executable instructions that, responsive to execution by the one or more hardware-based processors, implement a semiconductor design system to:
create a semiconductor layout comprising a resistor structure, the resistor structure having a defined baseline sheet resistance, the semiconductor layout including a resistor marker layer over the resistor structure;
perform a sheet resistance matching estimate to ascertain a difference between the baseline sheet resistance and a resultant sheet resistance if the resistor structure were to be manufactured using a manufacturing process; and
generate a mask generating algorithm based on the difference effective to achieve a sheet resistance of the resistor structure that is closer to the baseline sheet resistance rather than the resultant sheet resistance, the generation of the mask enabling one or more masks to be generated to modify the resistor structure relative to the resistor marker layer by segmenting the resistor structure defined by the semiconductor layout into individual segmentation structures.

15. The apparatus as recited in claim 14, wherein to modify the resistor structure relative to the resistor marker layer the semiconductor design system is further implemented to modify a width of the resistor structure or to reduce the width of the resistor structure.

16. The apparatus as recited in claim 14, wherein to modify the resistor structure relative to the resistor marker layer the semiconductor design system is further implemented to modify a length of the resistor structure or reduce the length of the resistor structure.

17. The apparatus as recited in claim 14, wherein the one or more masks comprise a mask useful to conduct a silicide process to form the resistor structure.

18. The apparatus as recited in claim 14, wherein the individual segmentation structures into which the resistor structure is divided are rectangular in shape.

19. The apparatus as recited in claim 14, wherein the one or more masks comprise an ion implantation mask useful to conduct ion implantation to form the resistor structure.

20. The apparatus as recited in claim 14, wherein the semiconductor layout includes a gate-last, high-K metal gate device structure located adjacent the resistor structure.

\* \* \* \* \*